US008314872B2

(12) United States Patent
Hiramoto et al.

(10) Patent No.: US 8,314,872 B2
(45) Date of Patent: Nov. 20, 2012

(54) IMAGING DEVICE

(75) Inventors: Masao Hiramoto, Osaka (JP); Kazuya Yonemoto, Osaka (JP); Yoshiaki Sugitani, Nara (JP)

(73) Assignee: Panasonic Corporation, Osaka (JP)

( * ) Notice: Subject to any disclaimer, the term of this patent is extended or adjusted under 35 U.S.C. 154(b) by 240 days.

(21) Appl. No.: 12/812,804

(22) PCT Filed: Nov. 16, 2009

(86) PCT No.: PCT/JP2009/006113
§ 371 (c)(1),
(2), (4) Date: Jul. 14, 2010

(87) PCT Pub. No.: WO2010/058545
PCT Pub. Date: May 27, 2010

(65) Prior Publication Data
US 2011/0050941 A1    Mar. 3, 2011

(30) Foreign Application Priority Data
Nov. 19, 2008    (JP) .................................. 2008-295209

(51) Int. Cl.
H04N 5/335    (2011.01)
(52) U.S. Cl. ......................... 348/308; 348/294; 348/280
(58) Field of Classification Search .................. 348/335, 348/336, 339, 342, 344, 308, 294; 250/208.1
See application file for complete search history.

(56) References Cited

U.S. PATENT DOCUMENTS

| 4,654,698 | A * | 3/1987 | Langworthy | 348/238 |
| 7,881,603 | B2 * | 2/2011 | Gere | 396/275 |
| 2003/0063204 | A1 | 4/2003 | Suda | |
| 2007/0235756 | A1 | 10/2007 | Kato | |
| 2011/0043661 | A1 * | 2/2011 | Podoleanu | 348/239 |

FOREIGN PATENT DOCUMENTS

| JP | 59-090467 | 5/1984 |
| JP | 59-042282 | 10/1984 |
| JP | 06-006646 | 1/1994 |
| JP | 2000-151933 | 5/2000 |
| JP | 2003-078917 | 3/2003 |
| JP | 2004-128201 | 4/2004 |
| JP | 2005-167356 | 6/2005 |
| JP | 2007-282054 | 10/2007 |

OTHER PUBLICATIONS

International Search Report for corresponding International Application No. PCT/JP2009/006113 mailed Feb. 16, 2010.

* cited by examiner

Primary Examiner — Tuan Ho
(74) Attorney, Agent, or Firm — Renner, Otto, Boisselle & Sklar, LLP

(57) ABSTRACT

A mirror 1a transmits a cyan (Cy) ray and reflects an R ray, and a mirror 1d transmits a yellow (Ye) ray and reflects a B ray. The mirrors 1a and 1d are arranged inside a light-transmitting member 3 and are also tilted so that the light reflected from each of them is further reflected from the interface between the light-transmitting member 3 and the air and then incident on an adjacent photosensitive cell. Photosensitive cells 2a and 2d receive the light rays that have been transmitted through the mirrors 1a and 1d, respectively. No mirrors are arranged over photosensitive cells 2b and 2c. The photosensitive cell 2b receives directly incident light and the light ray reflected from the mirror 1a. The photosensitive cell 2c receives the directly incident light and the light ray reflected from the mirror 1d. Color information is obtained by making computations on the output signals of the respective photosensitive cells.

20 Claims, 9 Drawing Sheets (a)

(b)

(c)

(a)

(b)

(a)

(b)

(c)

IMAGING DEVICE

TECHNICAL FIELD

The present invention relates to an image sensor structure for use in an image capture device.

BACKGROUND ART

Recently, the performance and functionality of digital cameras and digital movie cameras that use some solid-state imaging device such as a CCD and a CMOS (which will be sometimes referred to herein as an "image sensor") have been enhanced to an astonishing degree. In particular, the size of a pixel structure for use in a solid-state imaging device has been further reduced these days thanks to development of semiconductor device processing technologies, thus getting an even greater number of pixels and drivers integrated together in a solid-state imaging device. As a result, the resolution of an image sensor has lately increased significantly from one million pixels to ten million pixels in a matter of few years. Meanwhile, the greater the number of pixels in an image sensor, the lower the intensity of the light falling on a single pixel (which will be referred to herein as a "light intensity") and the lower the sensitivity of camera tends to be.

On top of that, in a normal color camera, a subtractive color filter that uses a pigment as a dye is arranged over each photosensing section of an image sensor, and therefore, the optical efficiency achieved is rather low. In a Bayer color filter, which uses a combination of one red (R) pixel, two green (G) pixels and one blue (B) pixel as a fundamental unit, the R filter transmits an R ray but absorbs G and B rays, the G filter transmits a G ray but absorbs R and B rays, and the B filter transmits a B ray but absorbs R and G rays. That is to say, each color filter transmits only one of the three colors of R, G and B and absorbs the other two colors. Consequently, the light ray used by each color filter is only approximately one third of the visible radiation falling on that color filter.

To overcome such a problem of decreased sensitivity, Patent Document No. 1 discloses a technique for increasing the intensity of the light received by attaching an array of micro lenses to a photodetector section of an image sensor. According to this technique, the incoming light is condensed with those micro lenses, thereby substantially increasing the aperture ratio. And this technique is now used in almost all solid-state imaging devices. It is true that the aperture ratio can be increased substantially by this technique but the decrease in optical efficiency by color filters still persists.

Thus, to avoid the decrease in optical efficiency and the decrease in sensitivity at the same time, Patent Document No. 2 discloses a solid-state imaging device that has a structure for taking in as much incoming light as possible by using dichroic mirrors and micro lenses in combination. Such a device uses a combination of dichroic mirrors, each of which does not absorb light but selectively transmits only a component of light falling within a particular wavelength range and reflects the rest of the light falling within the other wavelength ranges. Each dichroic mirror selects only a required component of the light, makes it incident on its associated photosensing section and transmits the rest of the light. FIG. 10 is a cross-sectional view of such an image sensor as the one disclosed in Patent Document No. 2.

In the image sensor shown in FIG. 10, the light that has reached a condensing micro lens 11 has its luminous flux adjusted by an inner lens 12, and then impinges on a first dichroic mirror 13, which transmits a red (R) ray but reflects rays of the other colors. The light ray that has been transmitted through the first dichroic mirror 13 is then incident on a photosensitive cell 23 that is located right under the first dichroic mirror 13. On the other hand, the light ray that has been reflected from the first dichroic mirror 13 impinges on a second dichroic mirror 14 adjacent to the first dichroic mirror 13. The second dichroic mirror 14 reflects a green (G) ray and transmits a blue (B) ray. The green ray that has been reflected from the second dichroic mirror 14 is incident on a photosensitive cell 24 that is located right under the second dichroic mirror 14. On the other hand, the blue ray that has been transmitted through the second dichroic mirror 14 is reflected from a third dichroic mirror 15 and then incident on a photosensitive cell 25 that is located right under the dichroic mirror 15. In this manner, in the image sensor shown in FIG. 10, the visible radiation that has reached the condensing micro lens 11 is not absorbed into color filters but its RGB components can be detected by the three photosensitive cells non-wastefully.

Likewise, Patent Documents Nos. 3 and 4 also disclose a technique for increasing the optical efficiency by taking advantage of reflection and transmission of incoming light. FIG. 11(a) illustrates a dichroic prism for a two tube color camera as disclosed in Patent Document No. 3. On the other hand, FIG. 11(b) illustrates a dichroic prism for a three tube color camera as disclosed in Patent Document No. 4. The dichroic prism 21 shown in FIG. 11(a) splits the incoming light into a G ray and the other rays (i.e., R and B rays), while the dichroic prism 22 shown in FIG. 11(b) splits the incoming light into R, G and B rays.

As described above, the image sensors disclosed in Patent Documents Nos. 2, 3 and 4 do not use any color filter that selectively transmits a light ray falling within a particular wavelength range and absorbs light rays falling within the other wavelength ranges. Instead, all of those image sensors use an optical element for selectively transmitting and reflecting light rays falling within particular wavelength ranges. That is to say, by using such color separating optical elements, the incoming light can be used much more efficiently.

Each of those image sensors disclosed in Patent Documents Nos. 2, 3 and 4, however, should have as many photosensitive cells as the optical elements to use or the colors to separate. That is why to sense red, green and blue rays, for example, the number of photosensitive cells provided should be tripled compared to a situation where conventional color filters are used.

Thus, to overcome such problems with the prior art, Patent Document No. 5 discloses a technique for increasing the optical efficiency by using dichroic mirrors and reflected light, although some loss of the incoming light is involved. FIG. 12 is a partial cross-sectional view of an image sensor that adopts such a technique. As shown in FIG. 12, dichroic mirrors 32 and 33 are embedded in a light-transmitting resin 31. Specifically, the dichroic mirror 32 transmits a G ray and reflects R and B rays, while the dichroic mirror 33 transmits an R ray and reflects G and B rays.

Such a structure cannot receive a B ray at its photosensing section but can sense R and G rays entirely under the following principle. First, if an R ray impinges on the dichroic mirrors 32 and 33, the R ray is reflected from the dichroic mirror 32, is totally reflected from the interface between the light-transmitting resin 31 and the air, and then strikes the dichroic mirror 33. Then, almost all of the R ray that has impinged on the dichroic mirror 33 will be incident on the photosensing section by way of the organic dye filter 35 and the micro lens 36 that transmit the R ray, even though only a part of the light is reflected from the metal layer 37. On the other hand, if a G ray impinges on the dichroic mirrors 32 and 33, the G ray is reflected from the dichroic mirror 33, is totally reflected from the interface between the light-transmitting resin 31 and the air, and then strikes the dichroic mirror 32. Then, almost all of the G ray that has impinged on the dichroic mirror 32 will eventually be incident on the photosensing section with virtually no loss by way of the organic dye filter 34 and the micro lens 36 that transmit the G ray.

According to the technique disclosed in Patent Document No. 5, only one of the three colors of RGB is lost but light rays of the other two colors can be received with almost no loss based on the principle described above. That is why there is no need to provide photosensing sections for all of the three colors of RGB. In this case, comparing such an image sensor to an image sensor that uses only organic dye filters, it can be seen that the sensitivity can be doubled by this technique because the image sensor that uses organic dye filters will achieve an optical efficiently of just one-third but this technique will achieve an optical efficiency of two-thirds. Nevertheless, even if such a technique is adopted, the optical efficiency cannot be 100%, as one out of the three colors should be sacrificed.

Citation List
Patent Literature
- Patent Document No. 1: Japanese Patent Application Laid-Open Publication No. 59-90467
- Patent Document No. 2: Japanese Patent Application Laid-Open Publication No. 2000-151933
- Patent Document No. 3: Japanese Patent Gazette for Opposition No. 59-42282
- Patent Document No. 4: Japanese Patent Application Laid-Open Publication No. 6-6646
- Patent Document No. 5: Japanese Patent Application Laid-Open Publication No. 2003-78917

SUMMARY OF INVENTION

Technical Problem

According to the conventional technologies, if light-absorbing color filters are used, the number of photosensitive cells to provide does not have to be increased significantly but the optical efficiency achieved will be low. Nevertheless, if dichroic mirrors or dichroic prisms are used, then the optical efficiency will be high but the number of photosensitive cells to provide should be increased considerably. Furthermore, according to the technique disclosed in Patent Document No. 5 that uses dichroic mirrors and reflection in combination, one out of the light rays in the three colors should be lost.

It is therefore an object of the present invention to provide an imaging technique that would realize color representation with almost no optical loss produced, even without increasing the number of photosensitive cells significantly. Another object of the present invention is to provide a technique for splitting not only visible radiation but also an infrared ray and a polarized light ray.

Solution to Problem

An image capture device according to the present invention includes: an image sensor; an optical system for producing an image on an imaging area of the image sensor; and an image signal processing section for processing an electrical signal supplied from the image sensor. The image sensor includes a number of units that are arranged on the imaging area. Each said unit includes: a first photosensitive cell; a second photosensitive cell; a light-transmitting member, which is arranged over the first and second photosensitive cells; and a first mirror, which is arranged inside the light-transmitting member so as to face the first photosensitive cell. The first mirror reflects a light ray falling within a first wavelength range, which is included in incoming light that has impinged on the first mirror, and transmits any other light ray falling within a non-first wavelength range, which is included in the incoming light. The light ray falling within the first wavelength range, which has been reflected from the first mirror, is further reflected from an interface between the light-transmitting member and another member and then incident on the second photosensitive cell, while the light ray falling within the non-first wavelength range, which has been transmitted through the first mirror, is incident on the first photosensitive cell. The first photosensitive cell receives the light ray falling within the non-first wavelength range that has been transmitted through the first mirror, and then outputs a first pixel signal representing the intensity of the light ray received. The second photosensitive cell receives not only the light ray falling within the first wavelength range that has been reflected from the interface between the light-transmitting member and the another member but also a light ray that has been directly incident on the second photosensitive cell without passing through the first mirror, and then outputs a second pixel signal representing the intensity of the light rays received. The image signal processing section performs computation processing, including calculating the difference between the first and second pixel signals, thereby outputting information about the intensity of the light ray falling within the first wavelength range among the overall incoming light that has been received by each said unit.

In one preferred embodiment, the light-transmitting member included in each said unit forms part of a transparent layer that covers the imaging area.

In another preferred embodiment, the light-transmitting member is in contact with the air at the interface.

In still another preferred embodiment, the second photosensitive cell is adjacent to the first photosensitive cell.

In yet another preferred embodiment, the light ray falling within the first wavelength range that has been reflected from the first mirror is totally reflected from the interface between the light-transmitting member and the another member.

In yet another preferred embodiment, the shape of the first mirror and/or the relative position of the first mirror to the first photosensitive cell in one of the units that is located at the center of the imaging area are/is different from the shape and/or position of the first mirror in another one of the units that is located on the periphery of the imaging area.

In yet another preferred embodiment, the first wavelength range corresponds to an infrared wavelength range.

In yet another preferred embodiment, each said unit further includes: a third photosensitive cell; a fourth photosensitive cell; and a second mirror, which is arranged inside the light-transmitting member so as to face the fourth photosensitive cell. The second mirror reflects a light ray falling within a second wavelength range, which is included in incoming light that has impinged on the second mirror, and transmits any other light ray falling within a non-second wavelength range, which is included in the incoming light. The light ray falling within the second wavelength range, which has been reflected from the second mirror, is further reflected from an interface between the light-transmitting member and another member and then incident on the third photosensitive cell, while the light ray falling within the non-second wavelength range, which has been transmitted through the second mirror, is incident on the fourth photosensitive cell. The third photosensitive cell receives not only the light ray falling within the second wavelength range that has been reflected from the interface between the light-transmitting member and the another member but also a light ray that has been directly incident on the third photosensitive cell without passing through the first or second mirror, and then outputs a third pixel signal representing the intensity of the light rays received. The fourth photosensitive cell receives the light ray falling within the non-second wavelength range that has been transmitted through the second mirror, and then outputs a fourth pixel signal representing the intensity of the light ray received. The image signal processing section performs computation processing, including calculating the difference between the third and fourth pixel signals, thereby outputting at least information about the intensity of the light ray falling within the second wavelength range among the overall incoming light that has been received by each said unit.

In one preferred embodiment, the fourth photosensitive cell is adjacent to the third photosensitive cell.

In this particular preferred embodiment, the third photosensitive cell is arranged adjacent to the first photosensitive cell, and the fourth photosensitive cell is arranged adjacent to the second photosensitive cell.

In a specific preferred embodiment, the first, second, third and fourth photosensitive cells are arranged in line one-dimensionally.

In still another preferred embodiment, the first wavelength range corresponds to a red wavelength range and the second wavelength range corresponds to a blue wavelength range.

In yet another preferred embodiment, the first and second mirrors are arranged so that all of the first, second, third and fourth photosensitive cells receive at least a light ray falling within a green wavelength range.

In yet another preferred embodiment, the second photosensitive cell includes first and second photoelectric conversion regions. The first photoelectric conversion region generates the third pixel signal based on the intensity of the light ray that the first photoelectric conversion region has received. And the second photoelectric conversion region generates the fourth pixel signal based on the intensity of the light ray that the second photoelectric conversion region has received.

In this particular preferred embodiment, the first wavelength range corresponds to red and blue wavelength ranges. Among the light rays falling within the red and blue wavelength ranges that have been reflected from the interface between the light-transmitting member and the another member and the light ray that has been directly incident on the second photosensitive cell without passing through the first mirror, the first photoelectric conversion region receives at least the light ray falling within the blue wavelength range and generates the third pixel signal. On the other hand, among the light rays falling within the red and blue wavelength ranges that have been reflected from the interface between the light-transmitting member and the another member and the light ray that has been directly incident on the second photosensitive cell without passing through the mirror, the second photoelectric conversion region receives at least the light ray falling within the red wavelength range and generates the fourth pixel signal. And the image signal processing section performs computation processing, including calculating the difference between the third and fourth pixel signals, thereby outputting color information.

In a specific preferred embodiment, among the light rays falling within the red and blue wavelength ranges that have been reflected from the interface between the light-transmitting member and the another member and the light ray that has been directly incident on the second photosensitive cell without passing through the first mirror, the first photoelectric conversion region receives a half of the light ray falling within the green wavelength range and the light ray falling within the blue wavelength range and generates the third pixel signal. On the other hand, among the light rays falling within the red and blue wavelength ranges that have been reflected from the interface between the light-transmitting member and the another member and the light ray that has been directly incident on the second photosensitive cell without passing through the mirror, the second photoelectric conversion region receives a half of the light ray falling within the green wavelength range and the light ray falling within the red wavelength range and generates the fourth pixel signal.

Another image capture device according to the present invention includes: an image sensor; an optical system for producing an image on an imaging area of the image sensor; and an image signal processing section for processing an electrical signal supplied from the image sensor. The image sensor includes a number of units that are arranged in a first direction. Each said unit includes: a first photosensitive cell; a second photosensitive cell; a light-transmitting member, which is arranged over the first and second photosensitive cells; a first mirror, which is arranged inside the light-transmitting member so as to face the first photosensitive cell; and a second mirror, which is arranged inside the light-transmitting member so as to face the second photosensitive cell. The first and second photosensitive cells are arranged parallel to the first direction. The first mirror reflects a light ray falling within a first wavelength range, which is included in incoming light that has impinged on the first mirror, and transmits any other light ray falling within a non-first wavelength range, which is included in the incoming light. The second mirror transmits a light ray falling within a second wavelength range, which is included in incoming light that has impinged on the second mirror, and reflects any other light ray falling within a non-second wavelength range, which is included in the incoming light. The light ray falling within the first wavelength range, which has been reflected from the first mirror, is further reflected from an interface between the light-transmitting member and another member and then incident on the second photosensitive cell, while the light ray falling within the non-first wavelength range, which has been transmitted through the first mirror, is incident on the first photosensitive cell. The light ray falling within the non-second wavelength range, which has been reflected from the second mirror, is further reflected from the interface between the light-transmitting member and the another member and then incident on the first photosensitive cell of an adjacent unit, while the light ray falling within the second wavelength range, which has been transmitted through the second mirror, is incident on the second photosensitive cell. The first photosensitive cell receives not only the light ray falling within the non-first wavelength range that has been transmitted through the first mirror but also the light ray falling within the non-second wavelength range that has been reflected from the adjacent second mirror and further reflected from the interface, and then outputs a first pixel signal representing the intensity of the light rays received. The second photosensitive cell receives not only the light ray falling within the second wavelength range that has been transmitted through the second mirror but also the light ray falling within the first wavelength range that has been reflected from the first mirror and then reflected from the interface and outputs a second pixel signal representing the intensity of the light rays received. And the image signal processing section performs computation processing, including calculating the difference between the first and second pixel signals, thereby outputting color information.

In one preferred embodiment, each said unit further includes: a third photosensitive cell; a fourth photosensitive cell; a third mirror, which is arranged inside the light-transmitting member so as to face the third photosensitive cell; and a fourth mirror, which is arranged inside the light-transmitting member so as to face the fourth photosensitive cell. The third and fourth photosensitive cells are arranged parallel to the first direction. The third mirror reflects a light ray falling within a third wavelength range, which is included in incoming light that has impinged on the third mirror, and transmits any other light ray falling within a non-third wavelength range, which is included in the incoming light. The fourth mirror transmits a light ray falling within a fourth wavelength range, which is included in incoming light that has impinged on the fourth mirror, and reflects any other light ray falling within a non-fourth wavelength range, which is included in the incoming light. The light ray falling within the third wavelength range, which has been reflected from the third mirror, is further reflected from an interface between the light-transmitting member and another member and then incident on the fourth photosensitive cell, while the light ray falling within the non-third wavelength range, which has been transmitted through the third mirror, is incident on the third photosensitive cell. The light ray falling within the non-fourth wavelength range, which has been reflected from the fourth mirror, is further reflected from the interface between the light-transmitting member and the another member and then incident on the third photosensitive cell of an adjacent unit, while the light ray falling within the fourth wavelength range, which has been transmitted through the fourth mirror, is incident on the fourth photosensitive cell. The third photosensitive cell receives not only the light ray falling within the non-third wavelength range that has been transmitted through the third mirror but also a light ray that has been reflected from the adjacent fourth mirror and further reflected from the interface, and then outputs a third pixel signal representing the intensity of the light rays received. The fourth photosensitive cell receives not only the light ray falling within the fourth wavelength range that has been transmitted through the fourth mirror but also the light ray falling within the third wavelength range that has been reflected from the third mirror and the interface, and then outputs a fourth pixel signal representing the intensity of the light rays received. And the image signal processing section performs computation processing, including calculating the difference between the third and fourth pixel signals, thereby outputting a different piece of color information from the color information.

Still another image capture device according to the present invention includes: an image sensor; an optical system for producing an image on an imaging area of the image sensor; and an image signal processing section for processing an electrical signal supplied from the image sensor. The image sensor includes a number of units that are arranged two-dimensionally. Each said unit includes: a first photosensitive cell; a second photosensitive cell; a light-transmitting member, which is arranged over the first and second photosensitive cells; and a first polarizing mirror, which is arranged inside the light-transmitting member so as to face the first photosensitive cell. The first polarizing mirror transmits a first polarization component, which is included in incoming light that has impinged on the first polarizing mirror, and reflects a second polarization component that is orthogonal to the first polarization component. The first polarization component that has been transmitted through the first polarizing mirror is incident on the first photosensitive cell, while the second polarization component that has been reflected from the first polarizing mirror is reflected from an interface between the light-transmitting member and another member and then incident on the second photosensitive cell. The first photosensitive cell receives the light ray with the first polarization component that has been transmitted through the first polarizing mirror, and then outputs a first pixel signal representing the intensity of the light ray received. The second photosensitive cell receives not only the light ray with the second polarization component that has been reflected from the interface between the light-transmitting member and the another member but also a light ray that has been directly incident on the second photosensitive cell without passing through the first polarizing mirror, and then outputs a second pixel signal representing the intensity of the light rays received. And the image signal processing section performs computation processing, including calculating the difference between the first and second pixel signals, thereby outputting polarization information.

In one preferred embodiment, each said unit further includes: a third photosensitive cell; a fourth photosensitive cell; and a second polarizing mirror, which is arranged inside the light-transmitting member so as to face the fourth photosensitive cell. The second polarizing mirror transmits a third polarization component, which is included in the incoming light that has impinged on the second polarizing mirror and which defines an angle of 45 degrees with respect to the first polarization component, and reflects a fourth polarization component that is orthogonal to the third polarization component. The third polarization component that has been transmitted through the second polarizing mirror is incident on the fourth photosensitive cell, while the fourth polarization component that has been reflected from the second polarizing mirror is further reflected from the interface between the light-transmitting member and the another member and then incident on the third photosensitive cell. The fourth photosensitive cell receives a light ray with the third polarization component that has been transmitted through the second polarizing mirror, and then outputs a fourth pixel signal representing the intensity of the light ray received.

The third photosensitive cell receives not only the light ray with the fourth polarization component that has been reflected from the interface between the light-transmitting member and the another member but also a light ray that has been incident on the third photosensitive cell without passing through the first or second polarizing mirror, and then outputs a third pixel signal representing the intensity of the light rays received. And the image signal processing section performs computation processing, including calculating the difference between the third and fourth pixel signals, thereby outputting a different piece of polarization information from the polarization information.

An image sensor according to the present invention includes a number of units that are arranged two-dimensionally. Each said unit includes: a first photosensitive cell; a second photosensitive cell; a light-transmitting member, which is arranged over the first and second photosensitive cells; and a first mirror, which is arranged inside the light-transmitting member so as to face the first photosensitive cell. The first mirror reflects a light ray falling within a first wavelength range, which is included in incoming light that has impinged on the first mirror, and transmits any other light ray falling within a non-first wavelength range, which is included in the incoming light. The light ray falling within the first wavelength range, which has been reflected from the first mirror, is further reflected from an interface between the light-transmitting member and another member and then incident on the second photosensitive cell, while the light ray falling within the non-first wavelength range, which has been transmitted through the first mirror, is incident on the first photosensitive cell. The first photosensitive cell receives the light ray falling within the non-first wavelength range that has been transmitted through the first mirror, and then outputs a first pixel signal representing the intensity of the light ray received. The second photosensitive cell receives not only the light ray falling within the first wavelength range that has been reflected from the interface between the light-transmitting member and the another member but also a light ray that has been directly incident on the second photosensitive cell without passing through the first mirror, and then outputs a second pixel signal representing the intensity of the light rays received.

Another image sensor according to the present invention includes a number of units that are arranged in a first direction. Each said unit includes: a first photosensitive cell; a second photosensitive cell; a light-transmitting member, which is arranged over the first and second photosensitive cells; a first mirror, which is arranged inside the light-transmitting member so as to face the first photosensitive cell; and a second mirror, which is arranged inside the light-transmitting member so as to face the second photosensitive cell. The first and second photosensitive cells are arranged parallel to the first direction. The first mirror reflects a light ray falling within a first wavelength range, which is included in incoming light that has impinged on the first mirror, and transmits any other light ray falling within a non-first wavelength range, which is included in the incoming light. The second mirror transmits a light ray falling within a second wavelength range, which is included in incoming light that has impinged on the second mirror, and reflects any other light ray falling within a non-second wavelength range, which is included in the incoming light. The light ray falling within the first wavelength range, which has been reflected from the first mirror, is further reflected from an interface between the light-transmitting member and another member and then incident on the second photosensitive cell, while the light ray falling within the non-first wavelength range, which has been transmitted through the first mirror, is incident on the first photosensitive cell. The light ray falling within the non-second wavelength range, which has been reflected from the second mirror, is further reflected from the interface between the light-transmitting member and the another member and then incident on the first photosensitive cell of an adjacent unit, while the light ray falling within the second wavelength range, which has been transmitted through the second mirror, is incident on the second photosensitive cell. The first photosensitive cell receives not only the light ray falling within the non-first wavelength range that has been transmitted through the first mirror but also the light ray falling within the non-second wavelength range that has been reflected from the adjacent second mirror and further reflected from the interface, and then outputs a first pixel signal representing the intensity of the light rays received. The second photosensitive cell receives not only the light ray falling within the second wavelength range that has been transmitted through the second mirror but also the light ray falling within the first wavelength range that has been reflected from the first mirror and further reflected from the interface, and then outputs a second pixel signal representing the intensity of the light rays received.

Still another image sensor according to the present invention includes a number of units that are arranged two-dimensionally. Each said unit includes: a first photosensitive cell; a second photosensitive cell; a light-transmitting member, which is arranged over the first and second photosensitive cells; and a first polarizing mirror, which is arranged inside the light-transmitting member so as to face the first photosensitive cell. The first polarizing mirror transmits a first polarization component, which is included in incoming light that has impinged on the first polarizing mirror, and reflects a second polarization component that is orthogonal to the first polarization component. The first polarization component that has been transmitted through the first polarizing mirror is incident on the first photosensitive cell, while the second polarization component that has been reflected from the first polarizing mirror is reflected from an interface between the light-transmitting member and another member and then incident on the second photosensitive cell. The first photosensitive cell receives the light ray with the first polarization component that has been transmitted through the first polarizing mirror, and then outputs a first pixel signal representing the intensity of the light ray received. The second photosensitive cell receives not only the light ray with the second polarization component that has been reflected from the interface between the light-transmitting member and the another member but also a light ray that has been directly incident on the second photosensitive cell without passing through the first polarizing mirror, and then outputs a second pixel signal representing the intensity of the light rays received.

Advantageous Effects of Invention

In an image capture device according to the present invention, the incoming light that has impinged on a mirror inside a light-transmitting member on an imaging area is split into a first light ray to be reflected from that mirror and a second light ray to be transmitted through that mirror. The first and second light rays are then incident on first and second photosensitive cells, respectively. And by performing computation processing including calculating the difference between the respective output signals of the two photosensitive cells, the intensities of the first and second light rays can be obtained. As a result, the optical efficiency can be increased even without using a color filter that absorbs light. Furthermore, if the present invention is applied to representing the three colors of RGB, the number of photosensitive cells to use can be reduced compared to the prior art.

DESCRIPTION OF EMBODIMENTS

Figure 1:
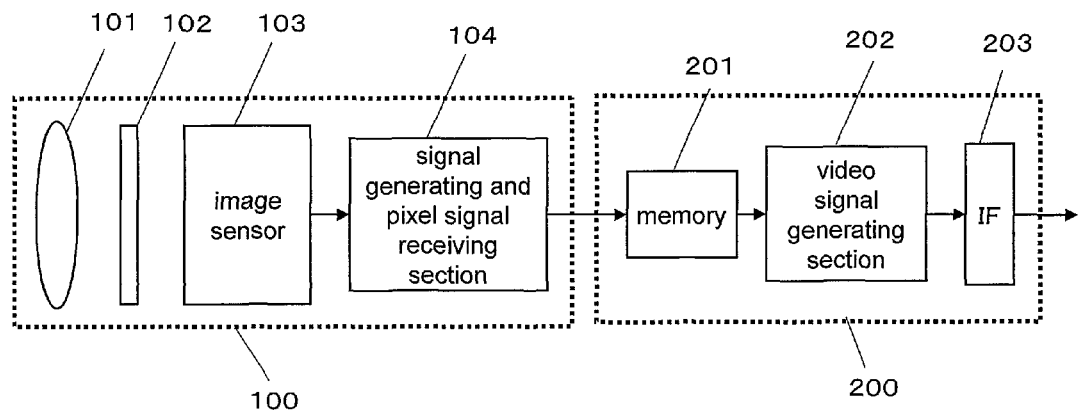
FIG. 1 is a block diagram illustrating an overall configuration for an image capture device as a first specific preferred embodiment of the present invention.

Hereinafter, preferred embodiments of the present invention will be described with reference to the accompanying drawings, in which any pair of components shown in multiple sheets and having substantially the same function will be identified by the same reference numeral.

(Embodiment 1)

FIG. 1 illustrates an overall configuration for an image capture device as a first specific preferred embodiment of the present invention. The image capture device shown in FIG. 1 includes an image capturing section 100 and an image signal processing section 200 that receives a signal from the image capturing section 100 and generates a video signal. The configuration and operation of the image capturing section 100 and the image signal processing section 200 will be described.

The image capturing section 100 includes a lens 101 for imaging a given subject, an optical plate 102, an image sensor 103 for converting optical information, which has been collected by imaging the subject through the lens 101 and the optical plate 102, into an electrical signal by photoelectric conversion, and a signal generating and pixel signal receiving section 104. In this case, the optical plate 102 is a combination of a quartz crystal low-pass filter for reducing a moiré pattern to be caused by a pixel arrangement with an infrared cut filter for filtering out infrared rays. The signal generating and pixel signal receiving section 104 generates a fundamental signal to drive the image sensor 103 and receives a signal from the image sensor 103 and passes it to the image signal processing section 200.

The image signal processing section 200 includes an image memory 201 to store the signal supplied from the signal generating and image signal receiving section 104, a video signal generating section 202 for generating a video signal (high definition signal) based on the data that has been read out from the image memory 201, and an interface (IF) section 203 that outputs the video signal to an external device.

Figure 2:
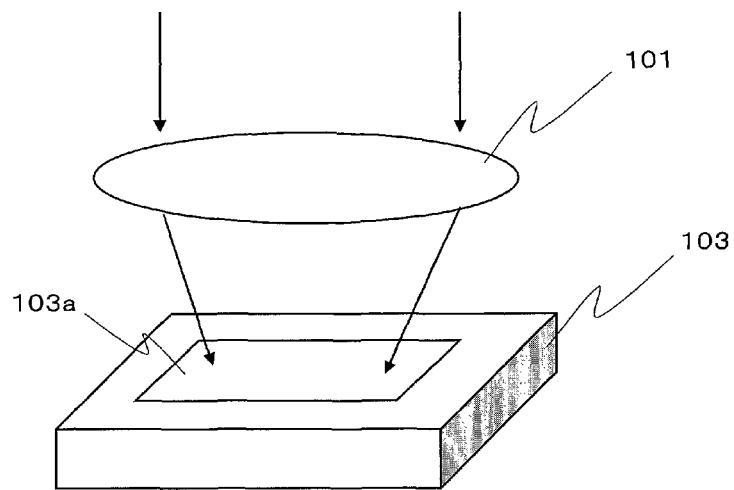
FIG. 2 is perspective view illustrating how a lens and an image sensor are arranged in the first preferred embodiment.

FIG. 2 schematically illustrates how the light that has been transmitted through the lens 101 is incident on the image sensor 103. On the imaging area 103a of the image sensor 103, arranged two-dimensionally are a lot of photosensitive cells. Since the light is imaged by the lens 101 and processed by the infrared cut filter, visible radiation is incident on the imaging area 103a. The intensity of the light falling on the imaging area 103a (which will be referred to herein as an "incident light intensity") varies according to the point of incidence. Those photosensitive cells are typically photodiodes, each of which outputs an electrical signal representing the incident light intensity by photoelectric conversion (such a signal will be referred to herein as a "photoelectrically converted signal" or a "pixel signal"). The image sensor 103 is typically implemented as a CCD or a CMOS sensor and is fabricated by known semiconductor device processing. In the image sensor 103 of this preferred embodiment, an array of dichroic mirrors is arranged so as to face that side with the array of photosensitive cells.

The dichroic mirror that can be used effectively in this preferred embodiment is a known mirror, which has a multi-layer structure consisting of a number of dielectric films with multiple different refractive indices. The dichroic mirror has the property of reflecting a light ray falling within a particular wavelength range and transmitting a light ray falling within any other wavelength range.

An image capture device according to this preferred embodiment can generate a color image signal by getting the light transmitted and reflected by the dichroic mirrors without using RGB color filters. Specifically, according to this preferred embodiment, in the output signal of a single photosensitive cell, multiple signal components representing the respective intensities of light rays falling within mutually different wavelength ranges have been superposed one upon the other. Even so, a color signal required can still be extracted by performing computations on the output signal of a single photosensitive cell and those of other photosensitive cells.

Hereinafter, the image sensor 103 of this preferred embodiment will be described with reference to FIGS. 3(a) through 3(c). In the following description, the colors red, green and blue will be identified by R, G and B, respectively.

Figure 3:
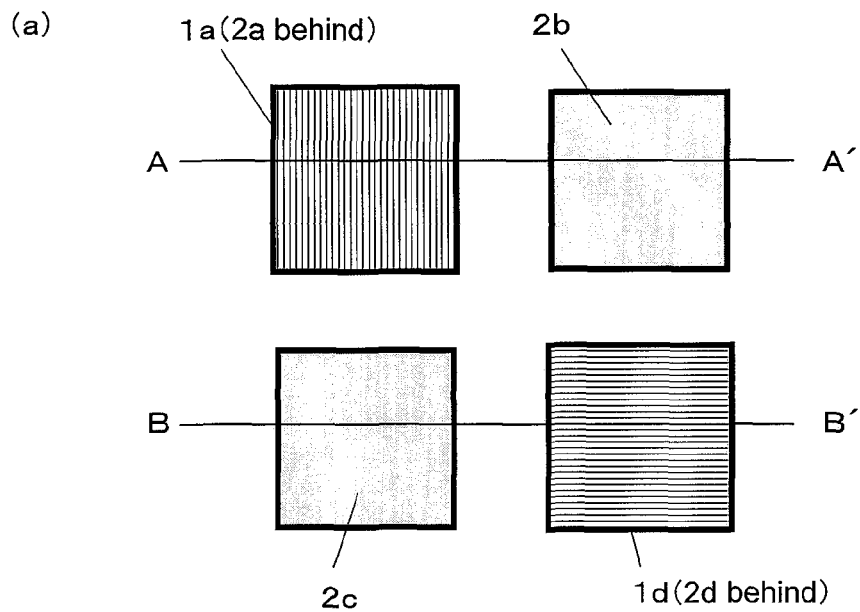
FIG. 3(a) is a plan view illustrating a fundamental arrangement of dichroic mirrors and photosensitive cells according to the first preferred embodiment of the present invention.
FIGS. 3(b) and 3(c) are cross-sectional views of the fundamental arrangement of dichroic mirrors and photosensitive cells of the first preferred embodiment as viewed on the plane A-A' and B-B', respectively.
Figure 3:
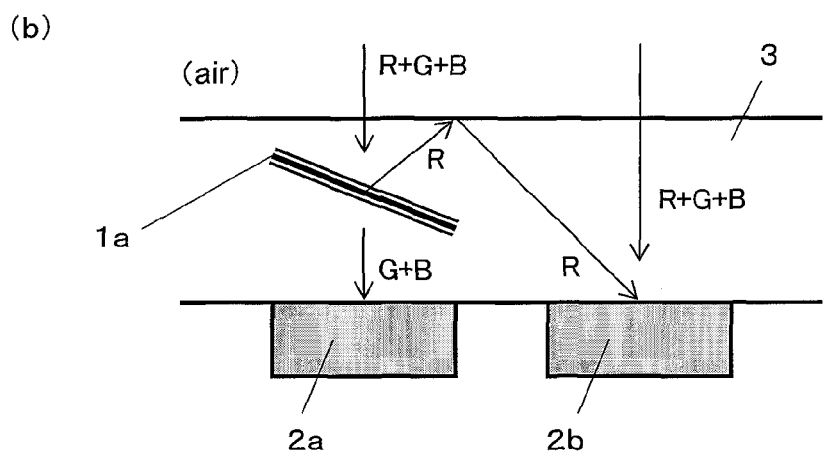
Figure 3:
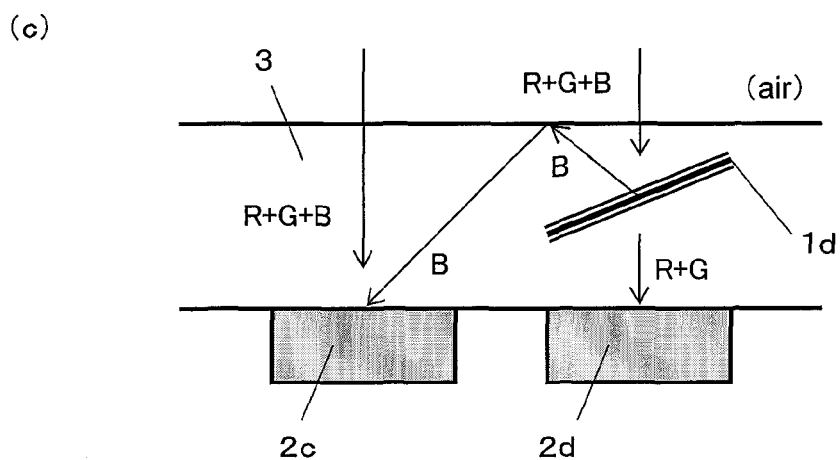

FIG. 3(a) is a plan view illustrating the arrangement of dichroic mirrors with respect to an array of photosensitive cells according to this preferred embodiment. FIGS. 3(b) and 3(c) are cross-sectional views as viewed on the respective plane A-A' and B-B' shown in FIG. 3(a). An image capture device actually has an array of photosensitive cells, in which a huge number of photosensitive cells are arranged in columns and rows. However, FIG. 3(a) illustrates only a fundamental unit consisting of four photosensitive cells 2a through 2d that are arranged in two columns and tow rows and two dichroic mirrors 1a and 1d for the sake of simplicity.

The dichroic mirrors 1a and 1d are arranged so as to cover the photosensitive cells 2a and 2d, respectively. A light-transmitting member 3 is arranged over the photosensitive cells 2a through 2d. And the dichroic mirrors 1a and 1d are arranged inside the light-transmitting member 3. In the example illustrated in FIGS. 3(b) and 3(c), the light-transmitting member 3 is arranged as a single layer on the array of photosensitive cells. However, the light-transmitting member 3 does not have to form a layer but may also be separated into multiple parts on a fundamental unit basis. The light-transmitting member 3 may be made of any material as long as the material has a higher refractive index than the air and can transmit visible radiation.

The dichroic mirror 1a has the property of transmitting a cyan ray (Cy=G+B) of the incoming light and reflecting an R ray. The dichroic mirror 1d has the property of transmitting a yellow ray (Ye=R+G) of the incoming light and reflecting a B ray. The tilt angle of the dichroic mirror 1a is adjusted so that the light ray reflected from the dichroic mirror 1a is further reflected from the interface between the light-transmitting member 3 and the air and then incident on the adjacent photosensitive cell 2b. In the same way, the tilt angle of the dichroic mirror 1d is adjusted so that the light ray reflected from the dichroic mirror 1d is further reflected from the interface between the light-transmitting member 3 and the air and then incident on the adjacent photosensitive cell 2c. It is preferred that such reflection from the interface be total reflection. However, the effects of the present invention could also be achieved even if the light were partially transmitted through the interface.

Hereinafter, the light rays received by the respective photosensitive cells and the photoelectrically converted signals provided by those photosensitive cells will be described with reference to FIGS. 3(b) and 3(c).

As shown in FIG. 3(b), the photosensitive cell 2a receives the cyan ray (Cy=G+B) that has been transmitted through the dichroic mirror 1a, while the photosensitive cell 2b receives directly incident visible radiation (W=R+G+B) and the R ray that has been reflected from the dichroic mirror 1a. As shown in FIG. 3(c), the photosensitive cell 2c receives the directly incident visible radiation (W=R+G+B) and the B ray that has been reflected from the dichroic mirror 1d, while the photosensitive cell 2d receives the yellow ray (Ye=R+G) that has been transmitted through the dichroic mirror 1d.

Next, the photoelectrically converted signals provided by the respective photosensitive cells will be described. In the following description, the signal components representing R, G and B rays will be identified herein by Rs, Gs and Bs, respectively. Since the photosensitive cell 2a receives the G and B ray components of the incident light, the photoelectrically converted signal S2a provided by the photosensitive cell 2a is represented by the following Equation (1):

$$S2a = Gs + Bs \quad (1)$$

In the same way, the photoelectrically converted signals S2b, S2c and S2d provided by the photosensitive cells 2b, 2c and 2d, respectively, are given by the following Equations (2), (3) and (4):

$$S2b = 2Rs + Gs + Bs \quad (2)$$

$$S2c = Rs + Gs + 2Bs \quad (3)$$

$$S2d = Rs + Gs \quad (4)$$

In these Equations (2) to (4), 2Rs and 2Bs mean doubles of the Rs and Bs signals, respectively. As can be seen from these Equations (1) to (4), the ratio of the R, G and B components included in the incident light can be obtained by getting Rs, Gs and Bs.

In this case, if a signal representing visible radiation is identified by Ws, then Ws=Rs+Gs+Bs needs to be satisfied. That is why Equations (1) to (4) can be modified into the following Equations (5) to (8):

$$S2a = Ws - Rs \quad (5)$$

$$S2b = Ws + Rs \quad (6)$$

$$S2c = Ws + Bs \quad (7)$$

$$S2d = Ws - Bs \quad (8)$$

By adding Equations (5) and (6) together, the following Equation (9) can be obtained. On the other hand, by subtracting Equation (5) from Equation (6), the following Equation (10) can be obtained. Likewise, the following Equation (11) can be obtained by adding together Equations (7) and (8) and the following Equation (12) can be obtained by subtracting Equation (8) from Equation (7):

$$S2a + S2b = 2Ws \quad (9)$$

$$S2b - S2a = 2Rs \quad (10)$$

$$S2c + S2d = 2Ws \quad (11)$$

$$S2c - S2d = 2Bs \quad (12)$$

Furthermore, Gs can also be obtained by subtracting Rs and Bs from Ws. In this manner, by making such calculations using S2a, S2b, S2c and S2d, three pieces of color information Rs, Gs and Bs and two pieces of intensity information Ws can be obtained without causing any optical loss. In addition, since the G ray component is included in the light to be incident on each photosensing section, good luminous efficacy is achieved in the image space.

As described above, according to this preferred embodiment, two different tilted dichroic mirrors are provided for photosensitive cells, which are arranged in two columns and two rows in a fundamental unit of the image sensor. In such an arrangement, either a cyan ray (Cy=G+B) or a yellow ray (Ye=R+G) is incident on the photosensitive cell that is located right under each of those dichroic mirrors. On the other hand, visible radiation (W=R +G+B) and an R or B ray are incident on each adjacent photosensitive cell. As a result, by performing addition and subtraction processing on the photoelectrically converted signals provided by the respective photosensitive cells, information about the three colors of RGB can be obtained with no loss. Consequently, the image capture device of this preferred embodiment achieves much higher performance than conventional devices. In addition, as each dichroic mirror is provided for two photosensitive cells, the light reflected from the dichroic mirror can be easily incident on the adjacent photosensitive cell. Furthermore, the dichroic mirrors can be arranged more easily when such an image capture device is fabricated because the density of the dichroic mirrors is lower than that of pixels (i.e., photosensitive cells).

In the preferred embodiment described above, a dichroic mirror that transmits G and B rays and a dichroic mirror that transmits R and G rays are supposed to be used. However, the present invention is in no way limited to that specific preferred embodiment. For example, supposing the visible radiation W is represented by C1+C2+C3 and the complementary colors of C1 and C2 are identified by C1 and C2, respectively, the dichroic mirror 1a has only to transmit C1 and the dichroic mirror 1d has only to transmit C2. Thus, speaking more generally, the light detection signals S2a, S2b, S2c and S2d of the photosensitive cells 2a, 2b, 2c and 2d are respectively represented by the following Equations (13) to (16):

$$S2a = Ws - C1s \quad (13)$$

$$S2b = Ws + C1s \quad (14)$$

$$S2c = Ws + C2s \quad (15)$$

$$S2d = Ws - C2s \quad (16)$$

2C1s can be obtained by subtracting Equation (13) from Equation (14). 2C2s can be obtained by subtracting Equation (16) from Equation (15). On the other hand, 2Ws can be obtained by adding Equations (13) and (14) together. And 2C3s can be obtained by subtracting 2C1s and 2C2s from 2Ws. In this manner, information about the three colors C1, C2 and C3 can be obtained with no optical loss.

Figure 4:
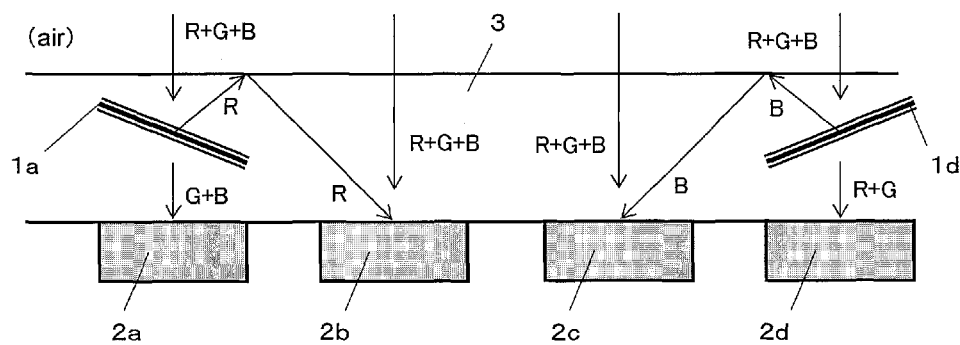
FIG. 4 is a cross-sectional view illustrating a fundamental unit consisting of dichroic mirrors and photosensitive cells that are arranged in four columns and one row according to the first preferred embodiment of the present invention.

The arrangement of this preferred embodiment shown in FIG. 3(a) is just an example. That is to say, according to the present invention, it is not always necessary to adopt such an arrangement. For example, the photosensitive cells 2a and 2b may be switched with each other, so may the photosensitive cells 2a and 2d. Also, in the preferred embodiment described above, two different kinds of dichroic mirrors are arranged in a checkerboard pattern with respect to a fundamental array of photosensitive cells arranged in two columns and two rows. However, the present invention is in no way limited to that specific preferred embodiment. Alternatively, the two kinds of dichroic mirrors may be arranged alternately in the row direction every other column as shown in FIG. 4. Even so, the same effects would also be achieved. Furthermore, the photosensitive cells 2a and 2b do not always have to be adjacent to each other. But the effects of the present invention will also be achieved even if there is any other element between the photosensitive cells 2a and 2b. The same can be said about the photosensitive cells 2c and 2d, too.

In the foregoing description of the first preferred embodiment of the present invention, the information about the three colors of RGB is supposed to be obtained with no optical loss by using the four photosensitive cells. However, in the image sensor of the present invention, its fundamental unit does not always consist of four photosensitive cells. That is to say, to extract only one of the three colors of RGB, the fundamental unit has only to include at least two cells and at least one dichroic mirror. For example, to obtain only an R ray by splitting the incident light, information about the R ray can be obtained with no loss by using the arrangement shown in FIG. 3(b) as a fundamental unit.

Figure 5:
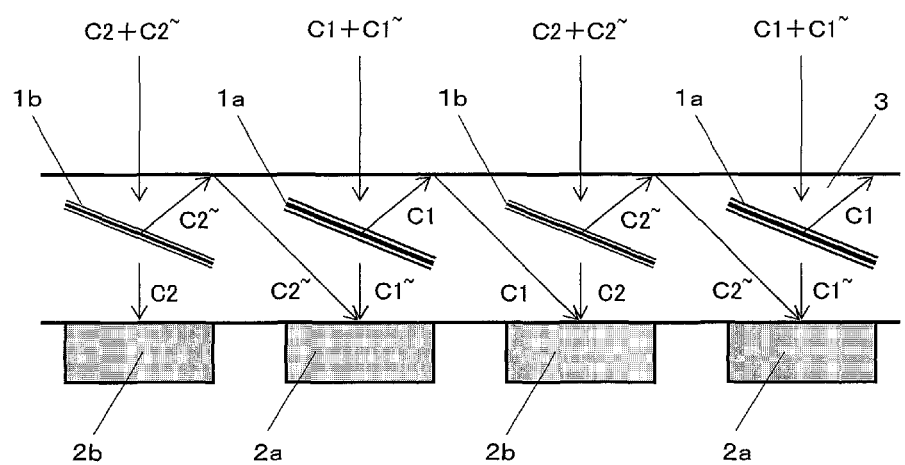
FIG. 5 is a cross-sectional view illustrating an image sensor in which dichroic mirrors are provided for respective photosensitive cells to receive primary color rays and complementary color rays.

Furthermore, in the preferred embodiment described above, a single dichroic mirror is supposed to be provided for two photosensitive cells. However, the present invention can also be carried out with a different arrangement from that one. For example, if a dichroic mirror that can split the incoming light into a light ray representing a certain color C1 and another light ray representing its complementary color C1 is used to make those two light rays incident on two different photosensitive cells, the effects of the present invention can also be achieved even by providing a single dichroic mirror for only one photosensitive cell. That is to say, if two adjacent photosensitive cells are arranged so as to receive a light ray representing one primary color and a light ray representing its complementary color, respectively, signals representing at least three colors can be obtained. FIG. 5 illustrates such an example. As shown in FIG. 5, the dichroic mirror 1a makes a light ray representing the complementary color C1 of a color C1 incident on the photosensitive cell 2a that is located right under itself and also makes the light ray representing the color C1 incident on the adjacent photosensitive cell 2b. On the other hand, the dichroic mirror 1b makes a light ray representing a color C2 incident on the photosensitive cell 2b that is located right under itself and also makes a light ray representing its complementary color C2 incident on the adjacent photosensitive cell 2a. If such an arrangement is adopted, the light detection signals S2a and S2b of the photosensitive cells 2a and 2b are represented by the following Equations (17) and (18), respectively:

$$S2a = C1s + C2s \quad (17)$$

$$S2b = C1s + C2s \quad (18)$$

Since C1s=C2s+C3s and C2s=C1s+C3s, these Equations (17) and (18) can be modified into the following Equations (19) and (20), respectively:

$$S2a = Ws + C3s \quad (19)$$

$$S2b = Ws - C3s \quad (20)$$

2C3s can be obtained by subtracting Equation (20) from Equation (19). Information about the other two colors can also be obtained by changing the properties of the dichroic mirror in a similar manner. Even if the arrangement shown in FIG. 5 is adopted, no optical loss is produced, either.

(Embodiment 2)

Figure 6:
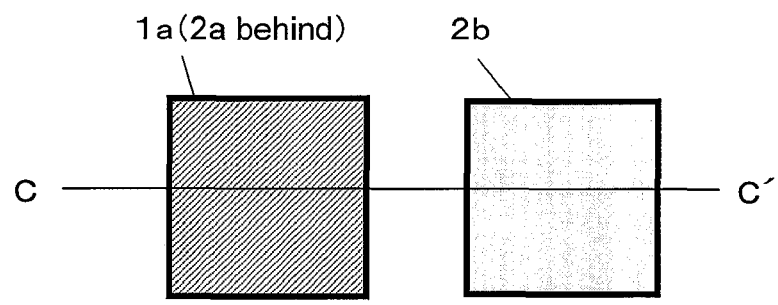
FIG. 6(a) is a plan view illustrating a fundamental arrangement of a dichroic mirror and photosensitive cells according to a second specific preferred embodiment of the present invention.
FIG. 6(b) is a cross-sectional view of the fundamental arrangement of a dichroic mirror and photosensitive cells of the second preferred embodiment as viewed on the plane C-C'.
Figure 6:
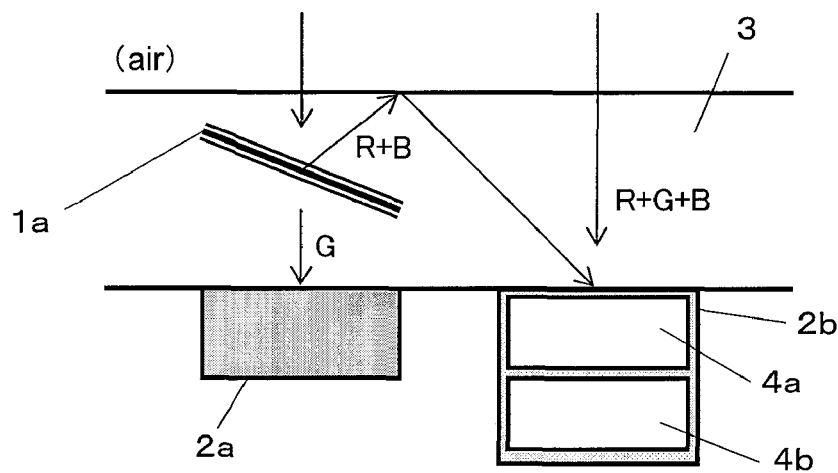

Hereinafter, a second specific preferred embodiment of the present invention will be described with reference to FIGS. 6(a) and 6(b). FIG. 6(a) is a plan view illustrating the fundamental arrangement of a dichroic mirror and photosensitive cells of an image sensor in an image capture device as the second preferred embodiment of the present invention, while FIG. 6(b) is a cross-sectional view of the image sensor as viewed on the plane C-C' shown in FIG. 6(a).

The image sensor of this preferred embodiment has a fundamental unit consisting of photosensitive cells 2a and 2b that are arranged in two columns and one row and a dichroic mirror 1a that is arranged to face the photosensitive cell 2a. Unlike the first preferred embodiment of the present invention described above, the photosensitive cell 2b of this preferred embodiment has two photoelectric conversion regions 4a and 4b, which are designed to receive light rays falling within mutually different wavelength ranges and output different photoelectrically converted signals. The dichroic mirror 1a has the property of transmitting a G ray and reflecting R and B rays. Also, the dichroic mirror 1a is tilted so that the light ray transmitted through the dichroic mirror 1a is incident on the photosensitive cell 2a and that the light ray reflected from the dichroic mirror 1a is incident on the adjacent photosensitive cell 2b. The photosensitive cell 2b has two photoelectric conversion regions 4a and 4b, which are stacked one upon the other in the depth direction of the image sensor so as to receive the light ray reflected from the dichroic mirror 1a and directly incident light. The image sensor of this preferred embodiment is made of silicon. That is why based on the light absorbing property of silicon, the photosensitive cell 2b is arranged so that the upper photoelectric conversion region 4a receives a half of the G ray and the B ray and that the lower photoelectric conversion region 4b receives the R ray and the other half of the G ray.

In such an arrangement, the G ray is incident on the photosensing section 2a to generate a photoelectrically converted signal S2a represented by the following Equation (21):

$$S2a = Gs \quad (21)$$

The photoelectric conversion region 4a receives a half of the G ray and the B ray, which are both included in the directly incident light that has not passed through the dichroic mirror 1a, and also receives mainly the B ray of the (R+B) rays reflected from the dichroic mirror 1a. On the other hand, the photoelectric conversion region 4b receives the other half of the G ray and the R ray, which are both included in the directly incident light that has not passed through the dichroic mirror 1a, and also receives mainly the R ray of the (R+B) rays reflected from the dichroic mirror 1a. As a result, the photoelectrically converted signals S4a and S4b provided by the photoelectric conversion regions 4a and 4b are represented by the following Equations (22) and (23):

$$S4a = Bs + Gs/2 + Bs \quad (22)$$

$$S4b = Rs + Gs/2 + Rs \quad (23)$$

S2a represented by Equation (21) can be used as a G signal as it is. By subtracting S2a/2 from S4a represented by Equation (22), a B signal 2Bs can be obtained. In the same way, by subtracting S2a/2 from S4b represented by Equation (23), an R signal 2Rs can be obtained. In this manner, the image sensor of this preferred embodiment can obtain RGB signals with no optical loss.

(Embodiment 3)

Figure 7:
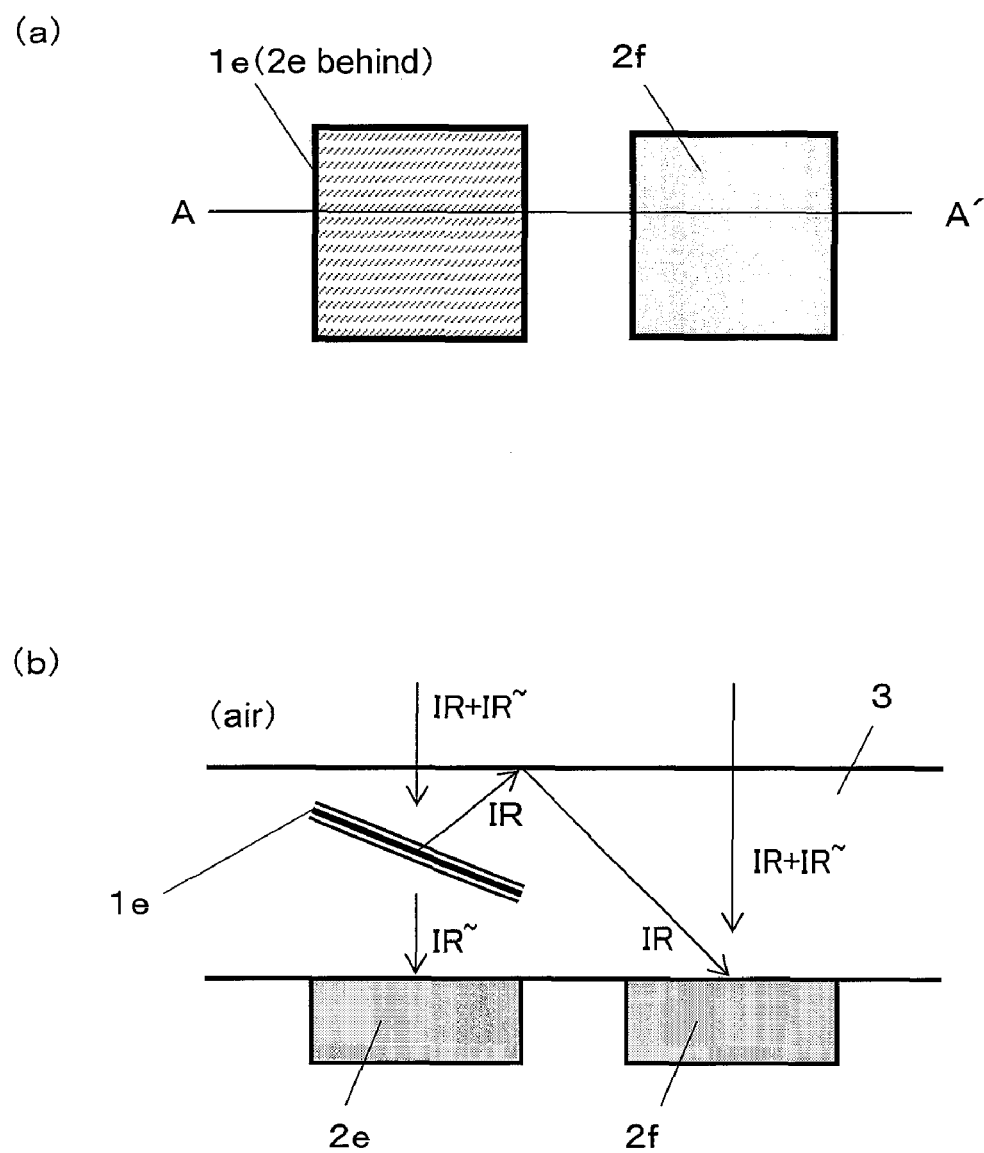
FIG. 7(a) is a plan view illustrating a fundamental arrangement of a mirror and photosensitive cells according to a third specific preferred embodiment of the present invention.
FIG. 7(b) is a cross-sectional view of the fundamental arrangement of a mirror and photosensitive cells of the third preferred embodiment as viewed on the plane A-A'.

Hereinafter, a third specific preferred embodiment of the present invention will be described with reference to FIGS. 7(a) and 7(b). An ordinary camera receives visible radiation through an infrared cut filter. Conversely, an infrared camera receives an infrared ray through an infrared pass filter. The image capture device of this preferred embodiment realizes a camera, of which the imaging area receives both visible radiation and an infrared ray alike without using an infrared cut filter. Specifically, according to this preferred embodiment, a mirror that reflects an infrared ray and transmits visible radiation is used. That is why this preferred embodiment does not contribute to getting color representation done by the image sensor but does use the principle of the present invention essentially. FIG. 7(a) is a plan view illustrating the fundamental arrangement of an image sensor according to a third specific preferred embodiment of the present invention, while FIG. 7(b) is a cross-sectional view of the image sensor as viewed on the plane A-A' shown in FIG. 7(a). Unlike the first preferred embodiment described above, the image capture device of this preferred embodiment uses a mirror that reflects an infrared ray and transmits visible radiation instead of the dichroic mirror.

The mirror 1e shown in FIGS. 7(a) and 7(b) transmits visible radiation and makes it incident on a photosensitive cell 2e. Also, the mirror 1e reflects an infrared ray and makes it incident on an adjacent photosensitive cell 2f.

As a result, the photosensitive cell 2e receives only the rest of the light other than the infrared ray (i.e., visible radiation). On the other hand, the photosensitive cell 2f receives directly incident visible radiation, a directly incident infrared ray, and the infrared ray that has been reflected from the mirror 1e. If the photoelectrically converted signals representing the infrared ray and the visible radiation are identified by IRs and IRs, respectively, the photoelectrically converted signals S2e and S2f provided by the photosensitive cells 2e and 2f are given by the following Equations (24) and (25), respectively:

$$S2e = IRs \quad (24)$$

$$S2f = IRs + 2IRs \quad (25)$$

The signal IRs representing the visible radiation is calculated by Equation (24). And by subtracting Equation (24) from Equation (25), the signal 2IRs representing the infrared ray can be obtained.

As described above, according to this preferred embodiment, a mirror that reflects an infrared ray and transmits visible radiation is used to make the visible radiation incident on a photosensitive cell that is arranged right under the mirror and to make the reflected infrared ray and directly incident light (visible radiation+infrared ray) reach an adjacent photosensitive cell. Thus, by calculating the output signal of the photosensitive cell, a visible radiation image and an infrared ray image can be obtained at the same time without causing any loss.

In the preferred embodiment described above, a mirror that reflects an infrared ray is used. However, the same effect is achieved even if a mirror that reflects visible radiation is used instead. Optionally, if an R ray reflecting mirror, a B ray reflecting mirror and an infrared ray reflecting mirror are used in combination by combining this preferred embodiment and the first preferred embodiment, a color camera that needs no infrared cut filter is also realized.

(Embodiment 4)

Next, a fourth specific preferred embodiment of the present invention will be described with reference to FIGS. 8(a) through 8(c) and FIG. 9. Unlike the first preferred embodiment described above, the image capture device of this preferred embodiment uses polarizing mirrors that reflect a particular polarization component and transmits the other polarization components, not the dichroic mirror. Normally, to produce a polarized image, the incoming light needs to be split and imaged separately using a P-wave polarizer and an S-wave polarizer. In other words, two cameras are needed. The image capture device of this preferred embodiment, however, uses a polarizing mirror that transmits 0 degree polarized light and a polarizing mirror that transmits 45 degree polarized light in an image sensor, thereby producing a polarized image using only one camera.

Figure 8:
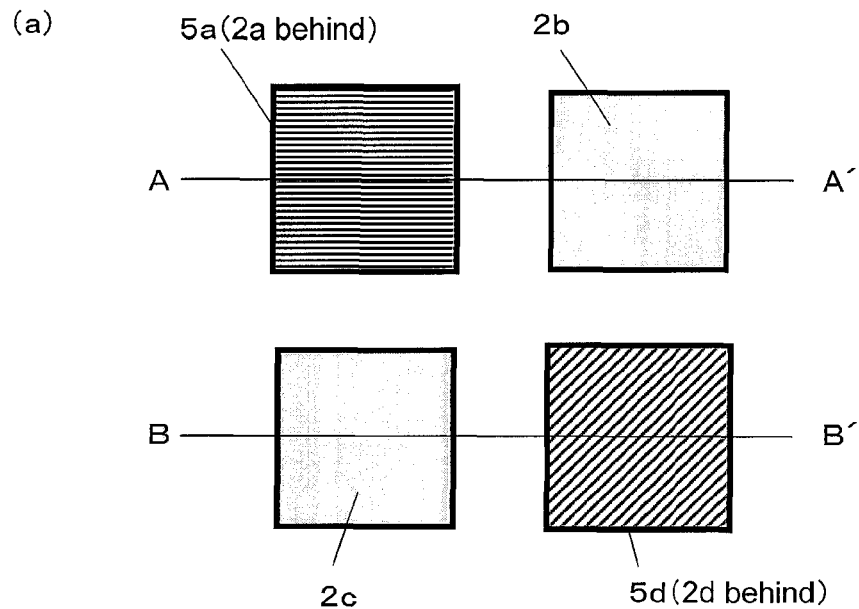
FIG. 8(a) is a plan view illustrating a fundamental arrangement of polarizing mirrors and photosensitive cells according to a fourth specific preferred embodiment of the present invention.
FIGS. 8(b) and 8(c) are cross-sectional views of the fundamental arrangement of polarizing mirrors and photosensitive cells as viewed on the plane A-A' and B-B', respectively.
Figure 8:
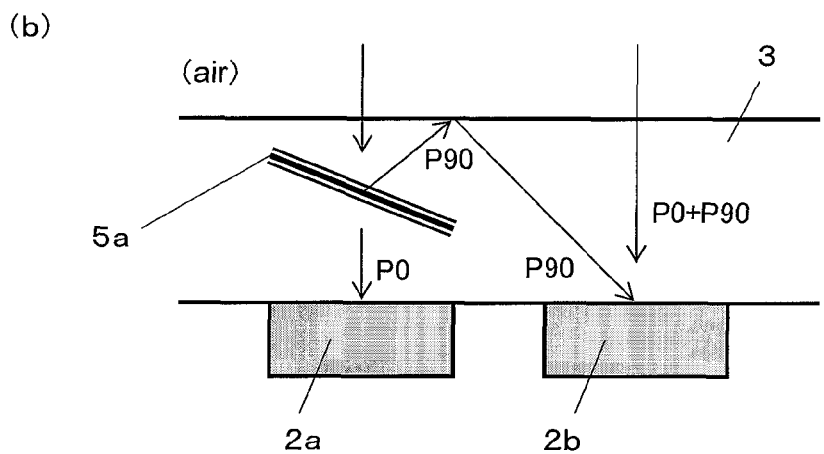
Figure 8:
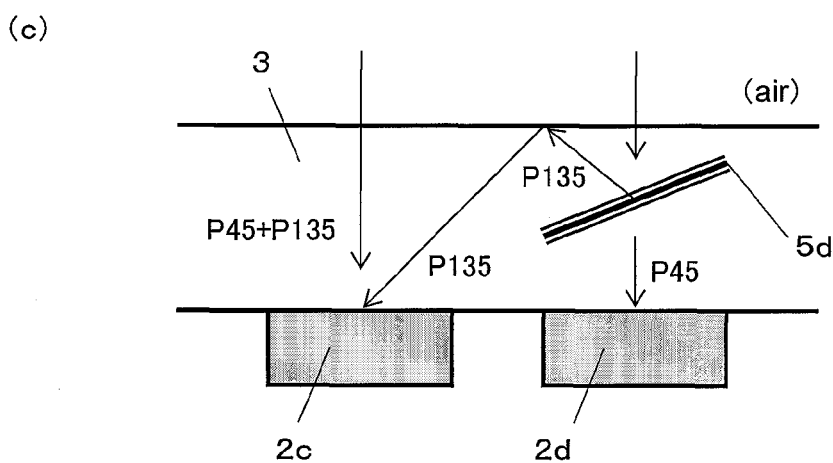

FIG. 8(a) is a plan view illustrating the arrangement of polarizing mirrors and an array of photosensitive cells in a fourth specific preferred embodiment of the present invention. FIGS. 8(b) and 8(c) are cross-sectional views thereof as viewed on the respective planes A-A' and B-B' shown in FIG. 8(a). Only a fundamental unit consisting of four photosensitive cells 2a through 2d that are arranged in two columns and two rows and two polarizing mirrors 5a and 5d is shown in FIG. 8(a) for the sake of simplicity.

The polarizing mirror 5a transmits a 0 degree polarized light ray and reflects a 90 degree polarized light ray. On the other hand, the polarizing mirror 5d transmits a degree polarized light ray and reflects a 135 degree polarized light ray.

Figure 9:
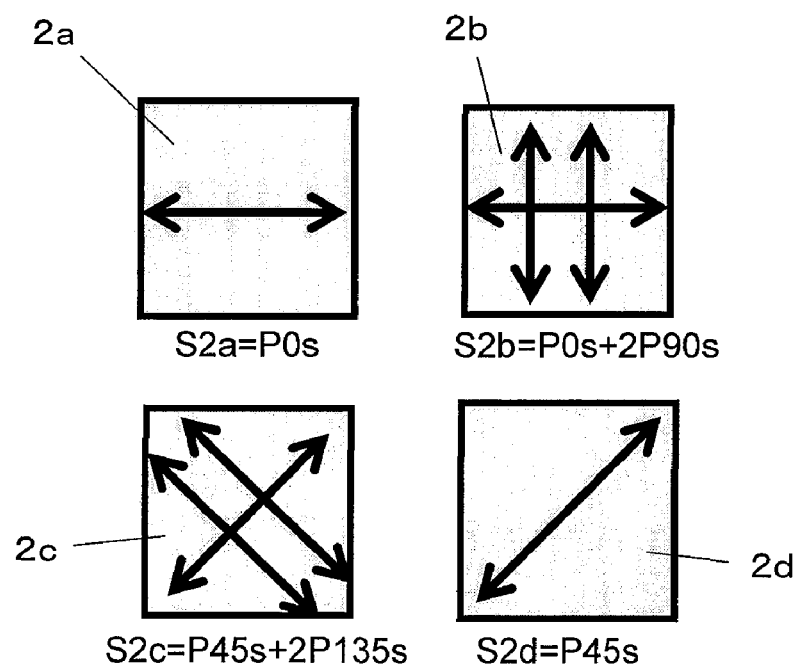
FIG. 9 is a plan view illustrating the polarization states of light rays received by respective photosensitive cells in the fourth preferred embodiment of the present invention.
Figure 10:
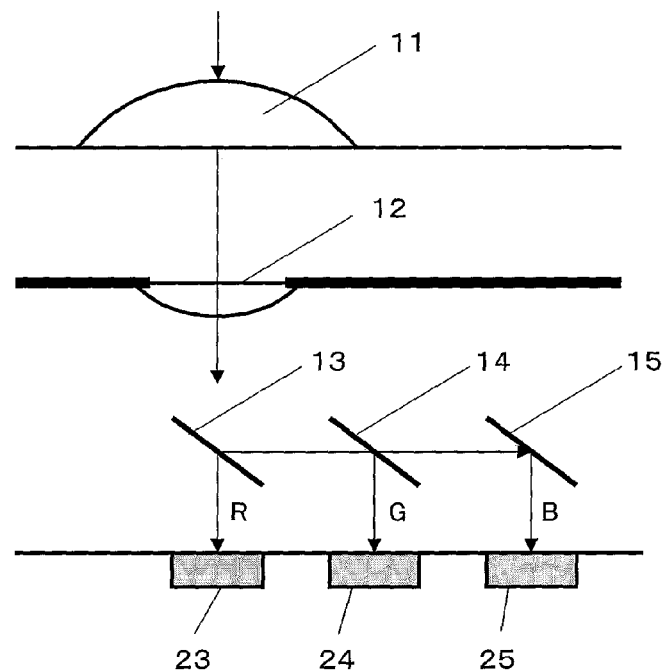
FIG. 10 is a cross-sectional view illustrating a conventional solid-state imaging element that uses a micro lens and dichroic mirrors in combination.
Figure 11:
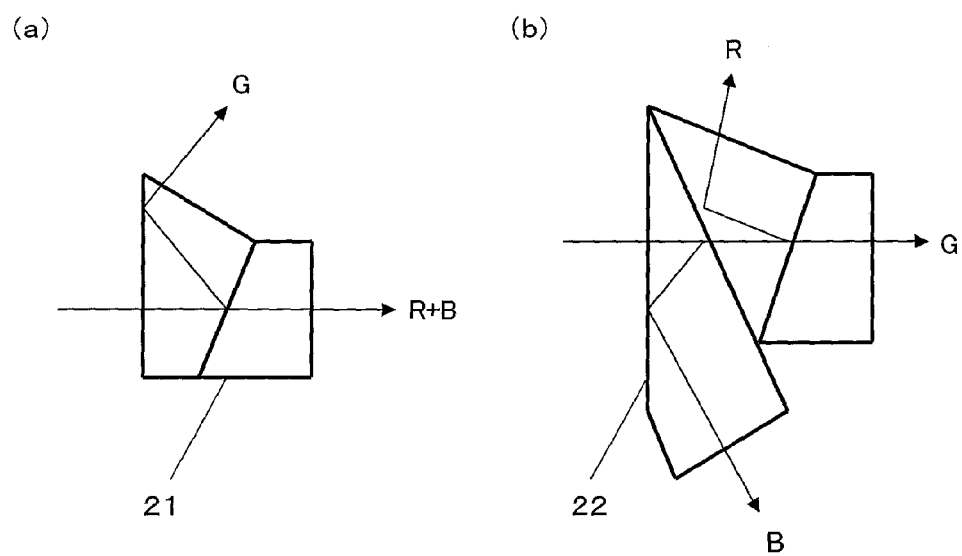
FIGS. 11(a) and 11(b) illustrate the appearance of an optical prism for a two tube color camera and that of an optical prism for a conventional three tube color camera.
Figure 12:
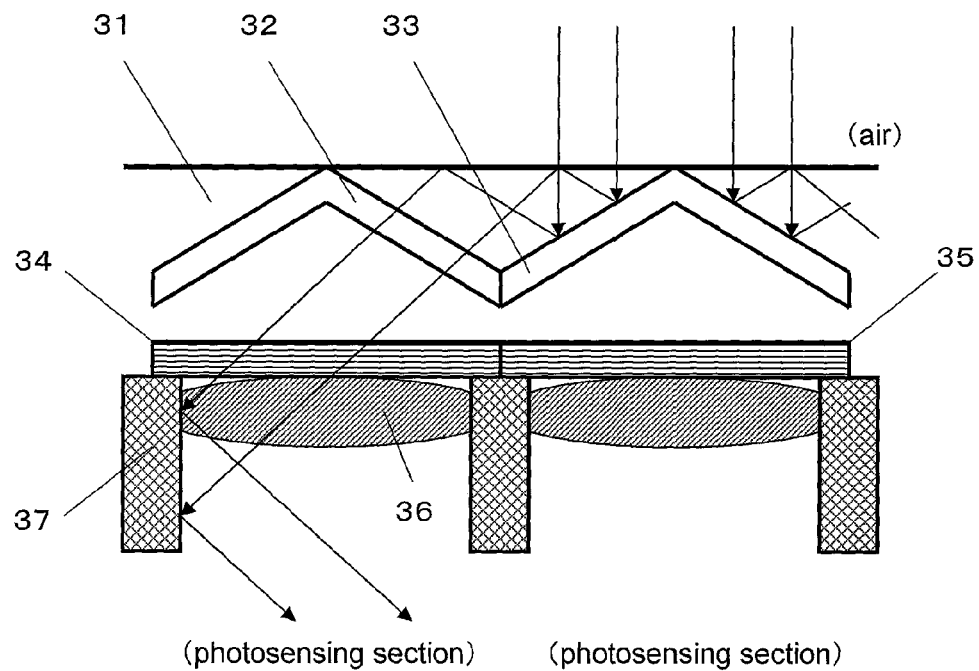
FIG. 12 is a cross-sectional view of a conventional solid-state imaging element that achieves increased optical efficiency by using reflection by dichroic mirrors.

FIG. 9 schematically illustrates the various kinds of polarized light rays received by the photosensitive cells 2a, 2b, 2c and 2d. The 0 degree polarized light ray is incident on the photosensitive cell 2a. Directly incoming light and the 90 degree polarized light ray that has been reflected from the polarizing mirror 5a are incident on the photosensitive cell 2b. The directly incident light and the 135 degree polarized light ray that has been reflected from the polarizing mirror 5d strike the photosensitive cell 2c. And the 45 degree polarized light ray is incident on the photosensitive cell 2d. As a result, the photoelectrically converted signals S2a, S2b, S2c and S2d provided by the photosensitive cells 2a, 2b, 2c and 2d are respectively represented by the following Equations (26) to (29):

$$S2a = P0s \quad (26)$$

$$S2b = P0s + 2P90s \quad (27)$$

$$S2c = P45s + 2P135s \quad (28)$$

$$S2d = P45s \quad (29)$$

where P0s, P45s, P90s and P135s respectively denote the photoelectrically converted signals of the 0 degree, 45 degree, 90 degree and 135 degree polarized light rays. The signal representing the directly incident light is identified by (P0s+P90s) in Equation (27) and by (P45s+P135s) in Equation (28).

Image information represented by the 0 degree and 45 degree polarized light rays can be obtained from S2a and S2d, respectively. And image information represented by the 90 degree and 135 degree polarized light rays can be obtained from (S2b-S2a) and (S2c-S2d), respectively. Consequently, four pieces of polarization information can be obtained from the four pixels with no loss and the polarization state of the image can be calculated.

As described above, according to the fourth preferred embodiment of the present invention, one polarizing mirror that transmits a 0 degree polarized light ray and one polarizing mirror that transmits a 45 degree polarized light ray are used for four photosensitive cells, thereby obtaining image information represented by the 0 degree, 45 degree, 90 degree and 135 degree polarized light rays with no loss. As a result, there is no need to prepare two cameras and only two kinds of polarizers need to be used.

In the first through fourth preferred embodiments of the present invention described above, to adapt to the main light ray coming through an imaging lens, the dichroic mirror, the infrared ray reflecting mirror or the polarizing mirror may have different shapes, different tilt angles or different distances from its associated photosensitive cell between central and peripheral portions of the imaging area. In that case, an image with even brightness and chromaticity distribution can be obtained. Optionally, if a condensing micro lens is provided inside the image sensor, a camera with even higher sensitivity is realized. Also, in the preferred embodiments described above, the photosensitive cells are supposed to be arranged two-dimensionally. However, this is just an example and the present invention is also applicable to an arrangement with a honeycomb structure. Likewise, the present invention is also applicable no less effectively to an image sensor that receives incident light on the entire surface such as an image sensor of the reverse irradiation type.

Industrial Applicability

The image capture device of the present invention can be used extensively in cameras that use a solid-state imaging element for general consumers including so-called "digital cameras" and "digital movie cameras", solid-state camcorders for TV broadcast personnel, industrial solid-state surveillance cameras, and so on. It should be noted that the present invention is applicable to every kind of color cameras even if the image capture device is not a solid-state imaging device.

REFERENCE SIGNS LIST 1a, 1b, 1d dichroic mirror
1e infrared ray reflecting mirror
2a, 2b, 2c, 2d, 2e, 2f image sensor's photosensitive cell
3 light-transmitting member
4a, 4b photoelectric conversion region
5a, 5b polarizing mirror
11 micro lens
12 inner lens
13 dichroic mirror reflecting all rays but red (R) ray
14 dichroic mirror reflecting only green (G) ray
15 dichroic mirror reflecting only blue (G) ray
21 optical prism for two tube color camera
22 optical prism for conventional three tube color camera
23, 24, 25 photosensitive cell
31 light-transmissive resin
32 dichroic mirror transmitting G ray
33 dichroic mirror transmitting R ray
34 organic dye filter transmitting G ray
35 organic dye filter transmitting R ray
36 micro lens
37 metal layer
100 image capturing section
101 optical lens
102 optical plate
103 image sensor
103a imaging area
104 signal generating and pixel signal receiving section
200 image signal processing section
201 memory
202 video signal generating section
203 video interface section

The invention claimed is:

1. An image capture device comprising:
an image sensor;
an optical system for producing an image on an imaging area of the image sensor; and
an image signal processing section for processing an electrical signal supplied from the image sensor,
wherein the image sensor includes a number of units that are arranged on the imaging area, and
wherein each said unit includes:
a first photosensitive cell;
a second photosensitive cell;
a light-transmitting member, which is arranged over the first and second photosensitive cells; and
a first mirror, which is arranged inside the light-transmitting member so as to face the first photosensitive cell, and
wherein the first mirror reflects a light ray falling within a first wavelength range, which is included in incoming light that has impinged on the first mirror, and transmits any other light ray falling within a non-first wavelength range, which is included in the incoming light, and
wherein the light ray falling within the first wavelength range, which has been reflected from the first mirror, is further reflected from an interface between the light-transmitting member and another member and then incident on the second photosensitive cell, while the light ray falling within the non-first wavelength range, which has been transmitted through the first mirror, is incident on the first photosensitive cell, and
wherein the first photosensitive cell receives the light ray falling within the non-first wavelength range that has been transmitted through the first mirror, and then outputs a first pixel signal representing the intensity of the light ray received, and
wherein the second photosensitive cell receives not only the light ray falling within the first wavelength range that has been reflected from the interface between the light-transmitting member and the another member but also a light ray that has been directly incident on the second photosensitive cell without passing through the first mirror, and then outputs a second pixel signal representing the intensity of the light rays received, and
wherein the image signal processing section performs computation processing, including calculating the difference between the first and second pixel signals, thereby outputting information about the intensity of the light ray falling within the first wavelength range among the overall incoming light that has been received by each said unit.

2. The image capture device of claim 1, wherein the light-transmitting member included in each said unit forms part of a transparent layer that covers the imaging area.

3. The image capture device of claim 1, wherein the light-transmitting member is in contact with the air at the interface.

4. The image capture device of claim 1, wherein the second photosensitive cell is adjacent to the first photosensitive cell.

5. The image capture device of claim 1, wherein the light ray falling within the first wavelength range that has been reflected from the first mirror is totally reflected from the interface between the light-transmitting member and the another member.

6. The image capture device of claim 1, wherein the shape of the first mirror and/or the relative position of the first mirror to the first photosensitive cell in one of the units that is located at the center of the imaging area are/is different from the shape and/or position of the first mirror in another one of the units that is located on the periphery of the imaging area.

7. The image capture device of claim 1, wherein the first wavelength range corresponds to an infrared wavelength range.

8. The image capture device of claim 1, wherein each said unit further includes:
   a third photosensitive cell;
   a fourth photosensitive cell; and
   a second mirror, which is arranged inside the light-transmitting member so as to face the fourth photosensitive cell, and
   wherein the second mirror reflects a light ray falling within a second wavelength range, which is included in incoming light that has impinged on the second mirror, and transmits any other light ray falling within a non-second wavelength range, which is included in the incoming light, and
   wherein the light ray falling within the second wavelength range, which has been reflected from the second mirror, is further reflected from an interface between the light-transmitting member and another member and then incident on the third photosensitive cell, while the light ray falling within the non-second wavelength range, which has been transmitted through the second mirror, is incident on the fourth photosensitive cell, and
   wherein the third photosensitive cell receives not only the light ray falling within the second wavelength range that has been reflected from the interface between the light-transmitting member and the another member but also a light ray that has been directly incident on the third photosensitive cell without passing through the first or second mirror, and then outputs a third pixel signal representing the intensity of the light rays received, and
   wherein the fourth photosensitive cell receives the light ray falling within the non-second wavelength range that has been transmitted through the second mirror, and then outputs a fourth pixel signal representing the intensity of the light ray received, and
   wherein the image signal processing section performs computation processing, including calculating the difference between the third and fourth pixel signals, thereby outputting at least information about the intensity of the light ray falling within the second wavelength range among the overall incoming light that has been received by each said unit.

9. The image capture device of claim 8, wherein the fourth photosensitive cell is adjacent to the third photosensitive cell.

10. The image capture device of claim 9, wherein the third photosensitive cell is arranged adjacent to the first photosensitive cell, and
   wherein the fourth photosensitive cell is arranged adjacent to the second photosensitive cell.

11. The image capture device of claim 8, wherein the first, second, third and fourth photosensitive cells are arranged in line one-dimensionally.

12. The image capture device of claim 8, wherein the first wavelength range corresponds to a red wavelength range and the second wavelength range corresponds to a blue wavelength range.

13. The image capture device of claim 8, wherein the first and second mirrors are arranged so that all of the first, second, third and fourth photosensitive cells receive at least a light ray falling within a green wavelength range.

14. The image capture device of claim 1, wherein the second photosensitive cell includes first and second photoelectric conversion regions, and
   wherein the first photoelectric conversion region generates the third pixel signal based on the intensity of the light ray that the first photoelectric conversion region has received, and
   wherein the second photoelectric conversion region generates the fourth pixel signal based on the intensity of the light ray that the second photoelectric conversion region has received.

15. The image capture device of claim 14, wherein the first wavelength range corresponds to red and blue wavelength ranges, and
   wherein among the light rays falling within the red and blue wavelength ranges that have been reflected from the interface between the light-transmitting member and the another member and the light ray that has been directly incident on the second photosensitive cell without passing through the first mirror, the first photoelectric conversion region receives at least the light ray falling within the blue wavelength range and generates the third pixel signal, and
   wherein among the light rays falling within the red and blue wavelength ranges that have been reflected from the interface between the light-transmitting member and the another member and the light ray that has been directly incident on the second photosensitive cell without passing through the mirror, the second photoelectric conversion region receives at least the light ray falling within the red wavelength range and generates the fourth pixel signal, and
   wherein the image signal processing section performs computation processing, including calculating the difference between the third and fourth pixel signals, thereby outputting color information.

16. The image capture device of claim 15, wherein among the light rays falling within the red and blue wavelength ranges that have been reflected from the interface between the light-transmitting member and the another member and the light ray that has been directly incident on the second photosensitive cell without passing through the first mirror, the first photoelectric conversion region receives a half of the light ray falling within the green wavelength range and the light ray falling within the blue wavelength range and generates the third pixel signal, and
   wherein among the light rays falling within the red and blue wavelength ranges that have been reflected from the interface between the light-transmitting member and the another member and the light ray that has been directly incident on the second photosensitive cell without passing through the mirror, the second photoelectric conversion region receives a half of the light ray falling within the green wavelength range and the light ray falling within the red wavelength range and generates the fourth pixel signal.

17. An image capture device comprising:
   an image sensor;
   an optical system for producing an image on an imaging area of the image sensor; and
   an image signal processing section for processing an electrical signal supplied from the image sensor,
   wherein the image sensor includes a number of units that are arranged in a first direction, and
   wherein each said unit includes:
   a first photosensitive cell;
   a second photosensitive cell;

a light-transmitting member, which is arranged over the first and second photosensitive cells;

a first mirror, which is arranged inside the light-transmitting member so as to face the first photosensitive cell; and a second mirror, which is arranged inside the light-transmitting member so as to face the second photosensitive cell, and wherein the first and second photosensitive cells are arranged parallel to the first direction, and wherein the first mirror reflects a light ray falling within a first wavelength range, which is included in incoming light that has impinged on the first mirror, and transmits any other light ray falling within a non-first wavelength range, which is included in the incoming light, and wherein the second mirror transmits a light ray falling within a second wavelength range, which is included in incoming light that has impinged on the second mirror, and reflects any other light ray falling within a non-second wavelength range, which is included in the incoming light, and wherein the light ray falling within the first wavelength range, which has been reflected from the first mirror, is further reflected from an interface between the light-transmitting member and another member and then incident on the second photosensitive cell, while the light ray falling within the non-first wavelength range, which has been transmitted through the first mirror, is incident on the first photosensitive cell, and wherein the light ray falling within the non-second wavelength range, which has been reflected from the second mirror, is further reflected from the interface between the light-transmitting member and the another member and then incident on the first photosensitive cell of an adjacent unit, while the light ray falling within the second wavelength range, which has been transmitted through the second mirror, is incident on the second photosensitive cell, and wherein the first photosensitive cell receives not only the light ray falling within the non-first wavelength range that has been transmitted through the first mirror but also the light ray falling within the non-second wavelength range that has been reflected from the adjacent second mirror and further reflected from the interface, and then outputs a first pixel signal representing the intensity of the light rays received, and wherein the second photosensitive cell receives not only the light ray falling within the second wavelength range that has been transmitted through the second mirror but also the light ray falling within the first wavelength range that has been reflected from the first mirror and further reflected from the interface, and then outputs a second pixel signal representing the intensity of the light rays received, and wherein the image signal processing section performs computation processing, including calculating the difference between the first and second pixel signals, thereby outputting color information.

18. The image capture device of claim 17, wherein each said unit further includes:

a third photosensitive cell;

a fourth photosensitive cell;

a third mirror, which is arranged inside the light-transmitting member so as to face the third photosensitive cell; and a fourth mirror, which is arranged inside the light-transmitting member so as to face the fourth photosensitive cell, and wherein the third and fourth photosensitive cells are arranged parallel to the first direction, and wherein the third mirror reflects a light ray falling within a third wavelength range, which is included in incoming light that has impinged on the third mirror, and transmits any other light ray falling within a non-third wavelength range, which is included in the incoming light, and wherein the fourth mirror transmits a light ray falling within a fourth wavelength range, which is included in incoming light that has impinged on the fourth mirror, and reflects any other light ray falling within a non-fourth wavelength range, which is included in the incoming light, and wherein the light ray falling within the third wavelength range, which has been reflected from the third mirror, is further reflected from an interface between the light-transmitting member and another member and then incident on the fourth photosensitive cell, while the light ray falling within the non-third wavelength range, which has been transmitted through the third mirror, is incident on the third photosensitive cell, and wherein the light ray falling within the non-fourth wavelength range, which has been reflected from the fourth mirror, is further reflected from the interface between the light-transmitting member and the another member and then incident on the third photosensitive cell of an adjacent unit, while the light ray falling within the fourth wavelength range, which has been transmitted through the fourth mirror, is incident on the fourth photosensitive cell, and wherein the third photosensitive cell receives not only the light ray falling within the non-third wavelength range that has been transmitted through the third mirror but also a light ray that has been reflected from the adjacent fourth mirror and further reflected from the interface, and then outputs a third pixel signal representing the intensity of the light rays received, and wherein the fourth photosensitive cell receives not only the light ray falling within the fourth wavelength range that has been transmitted through the fourth mirror but also the light ray falling within the third wavelength range that has been reflected from the third mirror and the interface, and then outputs a fourth pixel signal representing the intensity of the light rays received, and wherein the image signal processing section performs computation processing, including calculating the difference between the third and fourth pixel signals, thereby outputting a different piece of color information from the color information.

19. An image sensor comprising a number of units that are arranged two-dimensionally, wherein each said unit includes:

a first photosensitive cell;

a second photosensitive cell;

a light-transmitting member, which is arranged over the first and second photosensitive cells; and a first mirror, which is arranged inside the light-transmitting member so as to face the first photosensitive cell, and wherein the first mirror reflects a light ray falling within a first wavelength range, which is included in incoming light that has impinged on the first mirror, and transmits any other light ray falling within a non-first wavelength range, which is included in the incoming light, and wherein the light ray falling within the first wavelength range, which has been reflected from the first mirror, is further reflected from an interface between the light-transmitting member and another member and then incident on the second photosensitive cell, while the light ray falling within the non-first wavelength range, which has been transmitted through the first mirror, is incident on the first photosensitive cell, and wherein the first photosensitive cell receives the light ray falling within the non-first wavelength range that has been transmitted through the first mirror, and then outputs a first pixel signal representing the intensity of the light ray received, and wherein the second photosensitive cell receives not only the light ray falling within the first wavelength range that has been reflected from the interface between the light-transmitting member and the another member but also a light ray that has been directly incident on the second photosensitive cell without passing through the first mirror, and then outputs a second pixel signal representing the intensity of the light rays received.

20. An image sensor comprising a number of units that are arranged in a first direction, wherein each said unit includes:

a first photosensitive cell;

a second photosensitive cell;

a light-transmitting member, which is arranged over the first and second photosensitive cells;

a first mirror, which is arranged inside the light-transmitting member so as to face the first photosensitive cell; and a second mirror, which is arranged inside the light-transmitting member so as to face the second photosensitive cell, and wherein the first and second photosensitive cells are arranged parallel to the first direction, and wherein the first mirror reflects a light ray falling within a first wavelength range, which is included in incoming light that has impinged on the first mirror, and transmits any other light ray falling within a non-first wavelength range, which is included in the incoming light, and wherein the second mirror transmits a light ray falling within a second wavelength range, which is included in incoming light that has impinged on the second mirror, and reflects any other light ray falling within a non-second wavelength range, which is included in the incoming light, and wherein the light ray falling within the first wavelength range, which has been reflected from the first mirror, is further reflected from an interface between the light-transmitting member and another member and then incident on the second photosensitive cell, while the light ray falling within the non-first wavelength range, which has been transmitted through the first mirror, is incident on the first photosensitive cell, and wherein the light ray falling within the non-second wavelength range, which has been reflected from the second mirror, is further reflected from the interface between the light-transmitting member and the another member and then incident on the first photosensitive cell of an adjacent unit, while the light ray falling within the second wavelength range, which has been transmitted through the second mirror, is incident on the second photosensitive cell, and wherein the first photosensitive cell receives not only the light ray falling within the non-first wavelength range that has been transmitted through the first mirror but also the light ray falling within the non-second wavelength range that has been reflected from the adjacent second mirror and further reflected from the interface, and then outputs a first pixel signal representing the intensity of the light rays received, and wherein the second photosensitive cell receives not only the light ray falling within the second wavelength range that has been transmitted through the second mirror but also the light ray falling within the first wavelength range that has been reflected from the first mirror and further reflected from the interface, and then outputs a second pixel signal representing the intensity of the light rays received.

* * * * *